(12) United States Patent
Takahashi et al.

(10) Patent No.: US 7,615,872 B2
(45) Date of Patent: *Nov. 10, 2009

(54) SEMICONDUCTOR DEVICE

(75) Inventors: Noriyuki Takahashi, Yonezawa (JP); Masahiro Ichitani, Kodaira (JP); Rumiko Ichitani, legal representative, Kodaira (JP); Kazuhiro Ichitani, legal representative, Kodaira (JP); Sachiyo Ichitani, legal representative, Kodaira (JP)

(73) Assignees: Renesas Technology Corp., Tokyo (JP); Renesas Northern Japan Semiconductor, Inc., Hokkaido (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/314,209

(22) Filed: Dec. 5, 2008

(65) Prior Publication Data

US 2009/0091031 A1    Apr. 9, 2009

Related U.S. Application Data

(63) Continuation of application No. 10/927,106, filed on Aug. 27, 2004, now Pat. No. 7,479,705.

(30) Foreign Application Priority Data

Aug. 28, 2003    (JP)    ............................. 2003-303858

(51) Int. Cl.
*H01L 23/48* (2006.01)
*H01L 23/52* (2006.01)
*H01L 23/40* (2006.01)

(52) U.S. Cl. .................. 257/783; 257/787; 438/114

(58) Field of Classification Search ................. 257/783, 257/787, 784, 786, E23.126; 438/114
See application file for complete search history.

(56) References Cited

U.S. PATENT DOCUMENTS

| 4,686,492 | A |   | 8/1987 | Grellman et al. |
| 5,835,355 | A | * | 11/1998 | Dordi .......................... 361/760 |
| 5,897,337 | A | * | 4/1999 | Kata et al. .................. 438/114 |
| 5,973,403 | A |   | 10/1999 | Wark |
| 6,107,679 | A |   | 8/2000 | Noguchi |

(Continued)

FOREIGN PATENT DOCUMENTS

JP    11-186468    7/1999

(Continued)

*Primary Examiner*—Theresa T Doan
(74) *Attorney, Agent, or Firm*—Antonelli, Terry, Stout & Kraus, LLP.

(57) ABSTRACT

A semiconductor device comprises: a package substrate having a plurality of bonding electrodes arranged in a peripheral region of a main surface thereof and wirings connected to the respective bonding electrodes and electrolessly plated; a semiconductor chip mounted on the package substrate; a plurality of wires connecting pads of the semiconductor chip and the bonding electrodes; a sealing body for sealing the semiconductor chip and the wires with resin; and a plurality of solder balls arranged on the package substrate. The wirings are formed only at the inner side of the plurality of bonding electrodes on the main surface of the package substrate, and no solder resist film is formed at the outer side of the plurality of bonding electrodes. With this arrangement, the region outside the bonding electrodes can be minimized and the semiconductor device can be downsized without changing the size of the chip mounted thereon.

7 Claims, 18 Drawing Sheets

U.S. PATENT DOCUMENTS

| | | |
|---|---|---|
| 6,291,895 B1 | 9/2001 | Taniguchi et al. |
| 6,731,013 B2 | 5/2004 | Juso et al. |
| 6,853,089 B2 | 2/2005 | Ujiie et al. |
| 2002/0105096 A1 | 8/2002 | Hirata et al. |

FOREIGN PATENT DOCUMENTS

| | | |
|---|---|---|
| JP | 2000-077433 | 3/2000 |
| JP | 2001-203293 | 7/2001 |
| JP | 2002-261186 | 9/2002 |

* cited by examiner

SEMICONDUCTOR DEVICE

CROSS-REFERENCE TO RELATED APPLICATION

This application is a continuation of U.S. application Ser. No. 10/927,106, filed Aug. 27, 2004, now U.S. Pat. No. 7,479,705 and which application claims priority from Japanese Patent Application JP 2003-303858 filed on Aug. 28, 2003, the contents of which are hereby incorporated by reference into this application.

TECHNICAL FIELD OF THE INVENTION

The present invention relates to a semiconductor device and, more particularly, it relates to a technique that can be effectively applied to a semiconductor device comprising a wiring board and a semiconductor chip mounted thereon.

BACKGROUND OF THE INVENTION

A conventional semiconductor package (semiconductor device) having a substrate for mounting a semiconductor element (wiring board) is manufactured by laminating a photosensitive coverlay film with a thickness of 30 μm to be an insulating coating (insulating film) on the connection land side of the substrate, opening external connection terminals by development, and electrolessly plating the surface of the wiring conductor sequentially with nickel, palladium and gold (refer to Japanese Patent Application Laid-Open No. 2002-261186 (FIG. 1)).

SUMMARY OF THE INVENTION

As a result of the examination of the downsizing of a compact semiconductor device having a wiring board by the inventor of the present invention, the following problems have been found out.

In the case of currently available compact semiconductor devices, even if the semiconductor device main body is downsized, the chip size scarcely shrinks at the same time, and the chip size becomes very close to the size of the semiconductor device. Therefore, in this structure, the size of the semiconductor chip and that of the semiconductor device do not show a significant difference.

In such a structure, there is almost no space between the end of each bonding electrode to be connected to a conductive wire and the corresponding outer peripheral edge of the semiconductor device.

As a result, it is difficult to obtain sufficient adhesiveness and moisture-resistance of the sealing resin, and consequently, the reliability of a semiconductor device is reduced.

Therefore, it is an object of the present invention to provide a downsized semiconductor device.

Another object of the present invention is to provide a semiconductor device with an improved reliability.

The above and other objects and novel characteristics of the present invention will be apparent from the description of this specification and the accompanying drawings.

The representative one of the inventions disclosed in this application will be briefly described as follows.

That is, the present invention is a semiconductor device, which comprises: a wiring board having a main surface and a rear surface, a plurality of bonding electrodes arranged in rows at the outer side of a chip mounting region located at a central part of the main surface, and wirings connected respectively to the bonding electrodes, the wirings being electrolessly plated; a semiconductor chip mounted on the chip mounting region of the main surface of the wiring board; a plurality of conductive wires respectively connecting the electrodes of the semiconductor chip and the bonding electrodes corresponding to the electrodes; and a plurality of external terminals arranged on the rear surface of the wiring board, wherein the wirings are formed only at the inner side of the plurality of bonding electrodes on the main surface of the wiring board, and an insulating film of the main surface is not formed at the outer side of the plurality of bonding electrodes but formed below the chip.

The effects obtained by the representative one of the inventions disclosed in this application will be briefly described as follows.

By the electroless plating of the wirings on the wiring board, the power supply wirings become unnecessary. Therefore, it is possible to form the wirings only at the inner sides of the bonding electrodes. In other words, it is no longer necessary to form the insulating film at the outer sides of the bonding electrodes. Hence, it becomes possible to arrange the bonding electrodes at positions extremely close to the edges of the wiring board, and thus, the wiring board can be downsized. As a result, the semiconductor device can be downsized without changing the chip size.

DESCRIPTION OF THE PREFERRED EMBODIMENTS

Figure 1:
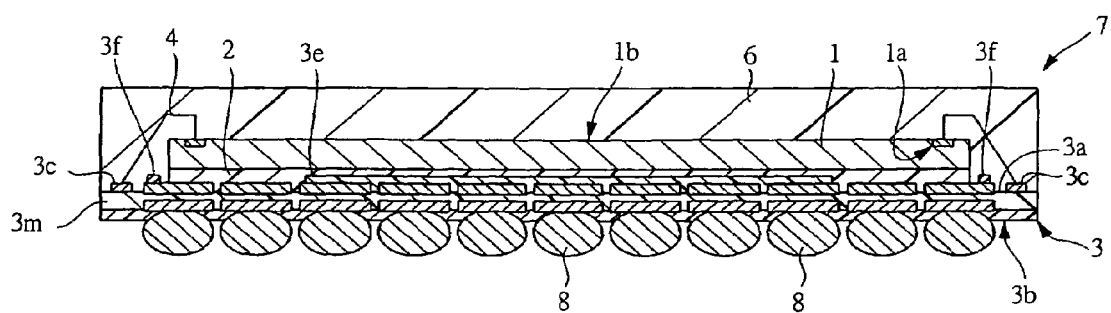
FIG. 1 is a cross sectional view showing an example of the structure of a semiconductor device according to the first embodiment of the present invention.

In the following description of the preferred embodiments of the present invention, the same or similar components will not be described repeatedly in principle.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of an element (including number of pieces, values, amount, range, and the like), the number of the element is not limited to a specific number unless otherwise stated or except the case where the number is apparently limited to a specific number in principle. The number larger or smaller than the specified number is also applicable.

Hereinafter, embodiments of the present invention will be described in detail with reference to the accompanying drawings. Note that components having the same function are denoted by the same reference numerals throughout the drawings for describing the embodiments, and the repetitive description thereof will be omitted.

First Embodiment

Figure 2:
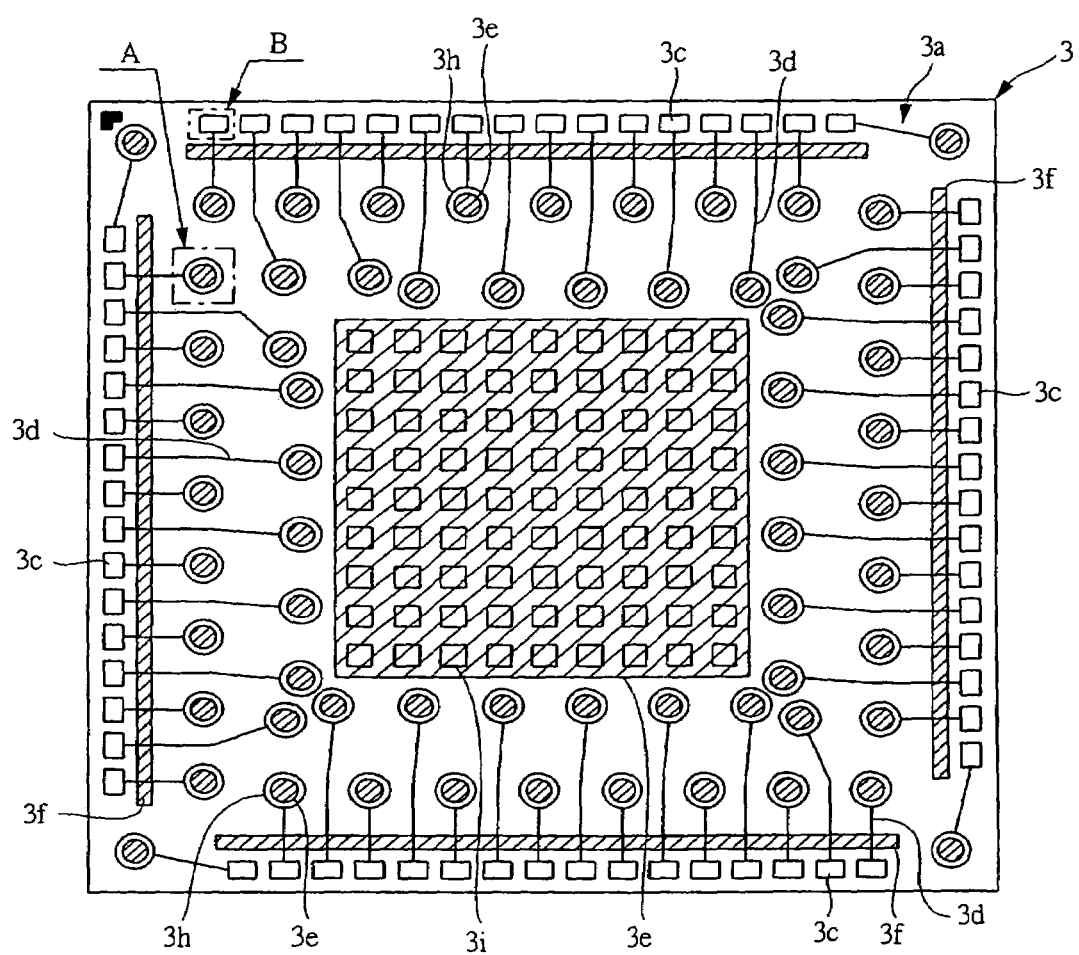
FIG. 2 is a plan view showing an example of the conductor pattern on the main surface of the wiring board incorporated in the semiconductor device of FIG. 1.
Figure 3:
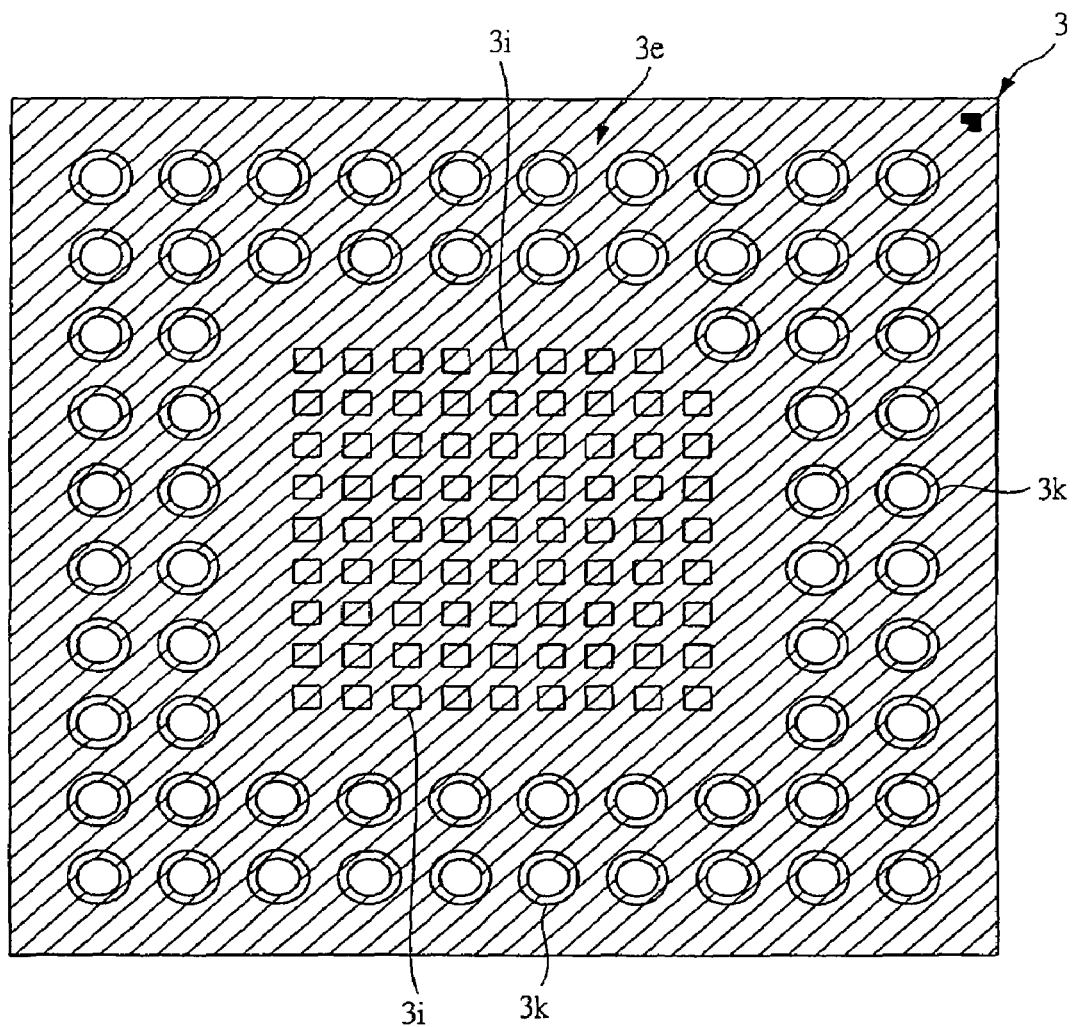
FIG. 3 is a bottom plan view showing an example of the conductor pattern on the rear surface of the wiring board of FIG. 2.
Figure 4:
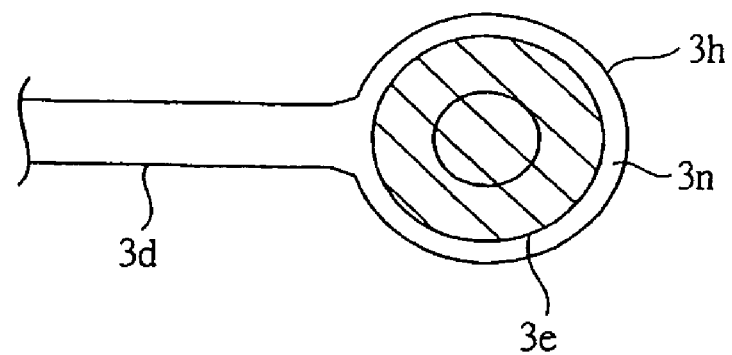
FIG. 4 is an enlarged partial plan view showing an example of the configuration of an area A in FIG. 2.
Figure 5:
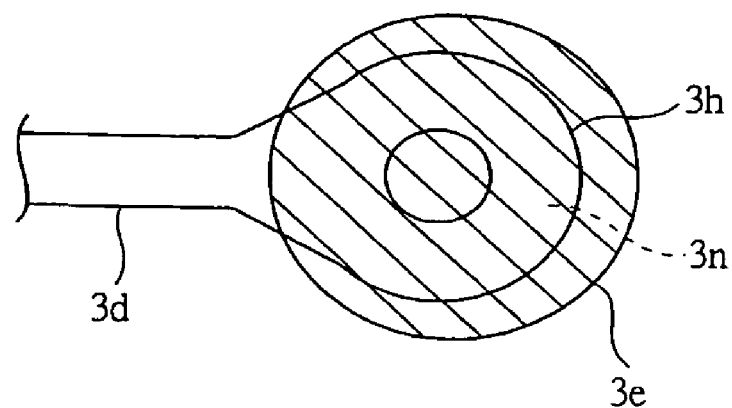
FIG. 5 is an enlarged partial plan view showing a modified example of the configuration of the area A in FIG. 2.
Figure 6:
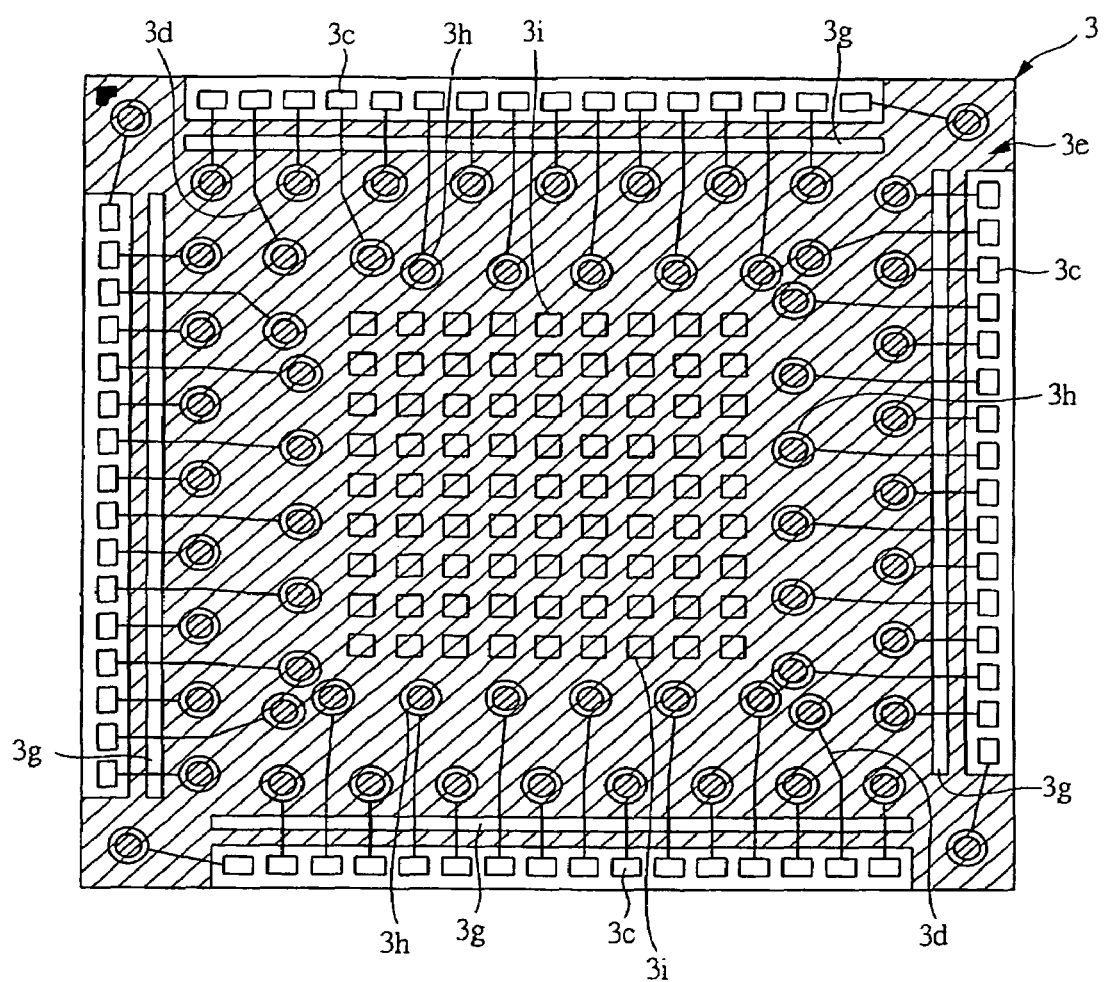
FIG. 6 is a plan view showing the insulating film formed on the main surface of the wiring board in a modified example.
Figure 7:
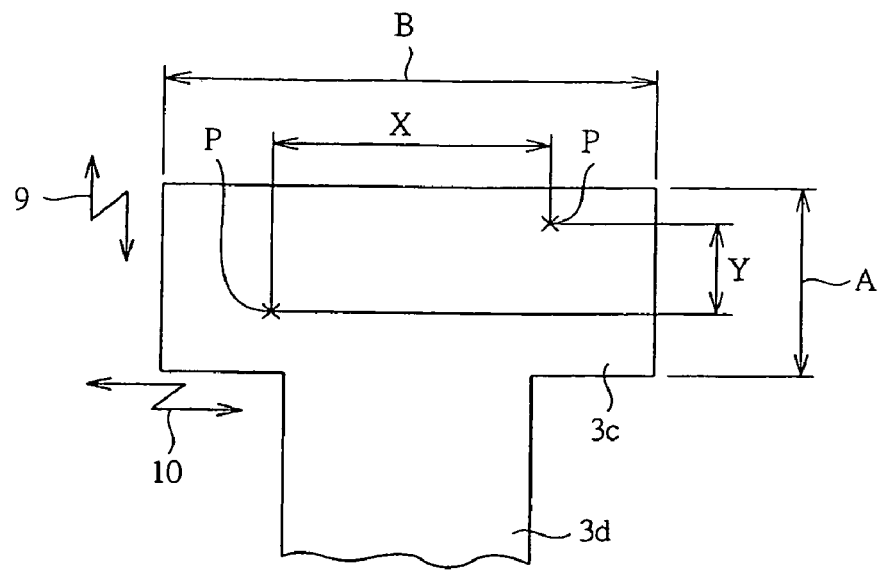
FIG. 7 is an enlarged partial plan view showing an example of the shape of the conductor pattern of an area B in FIG. 2.
Figure 8:
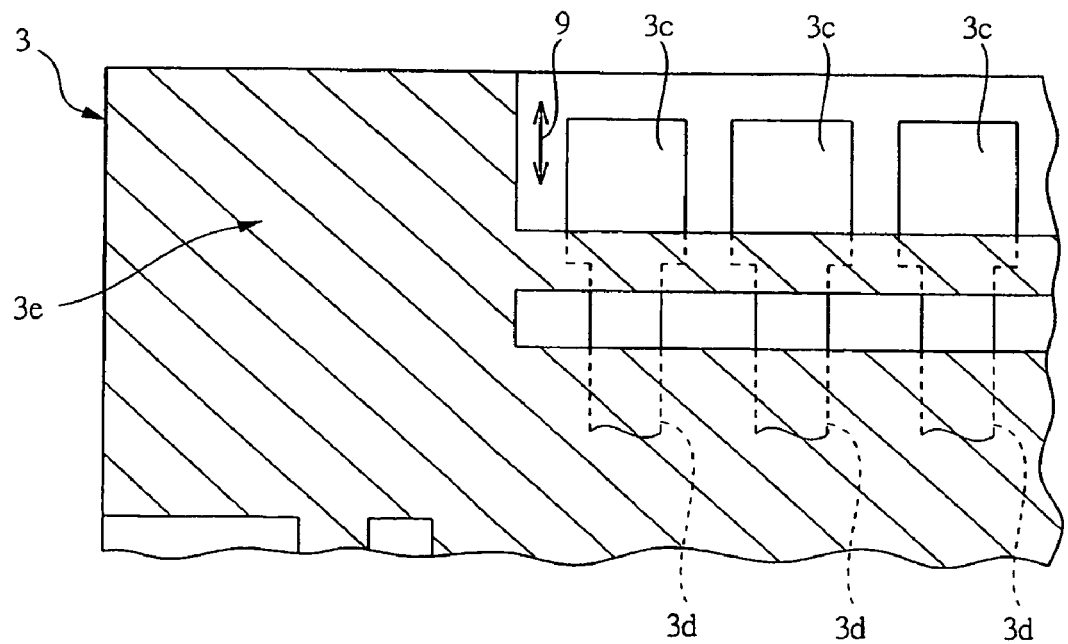
FIG. 8 is an enlarged partial plan view showing a modified example of the conductor pattern of the area B in FIG. 2.
Figure 9:
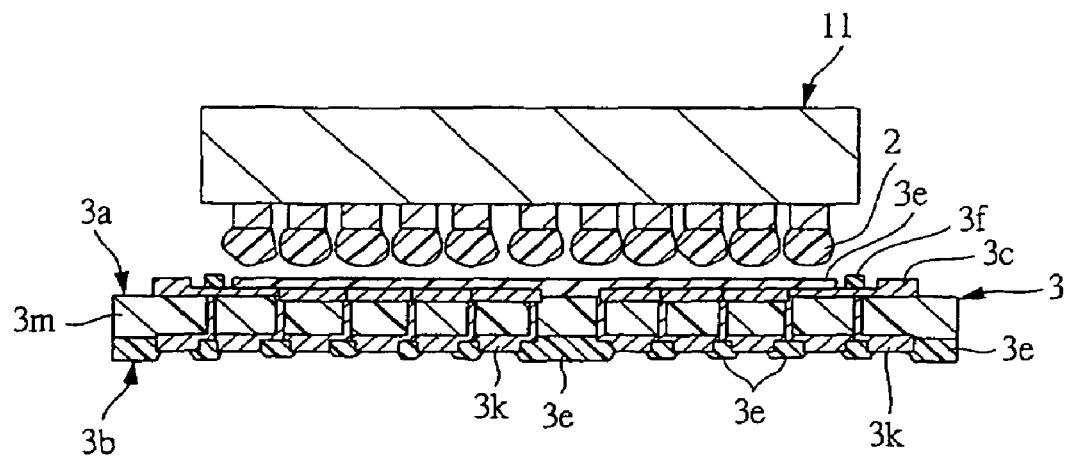
FIG. 9 is a cross sectional view illustrating an example of the method of applying a die bonding material used in the process of assembling the semiconductor device of FIG. 1.
Figure 10:
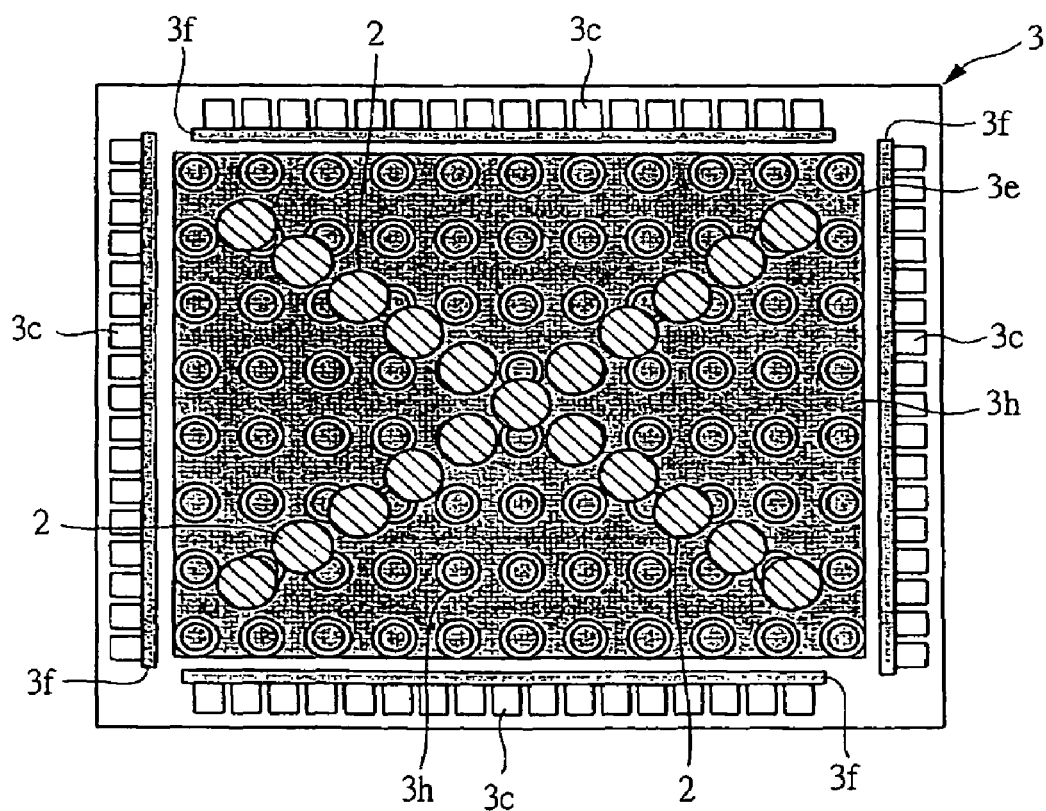
FIG. 10 is a plan view showing the applied die bonding material by means of the method of FIG. 9.
Figure 11:
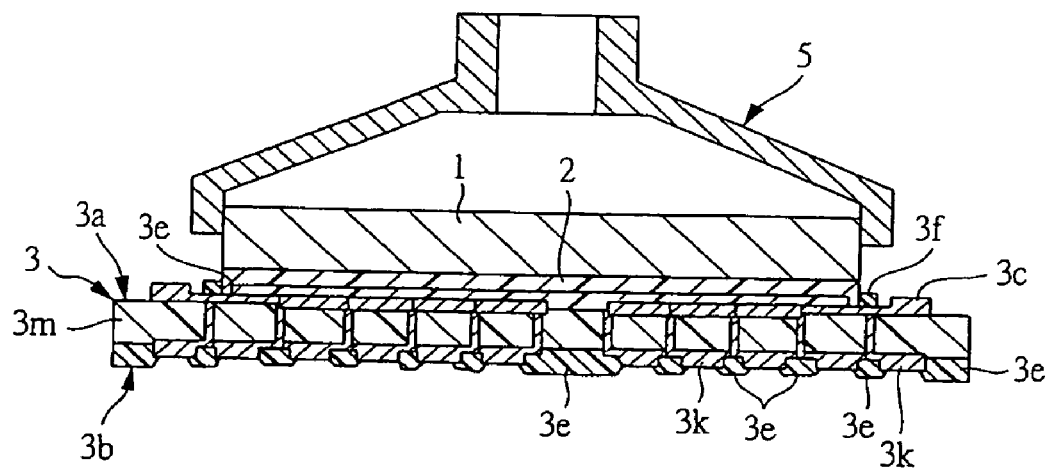
FIG. 11 is a cross sectional view showing an example of the method of die bonding in the process of assembling the semiconductor device of FIG. 1.
Figure 12:
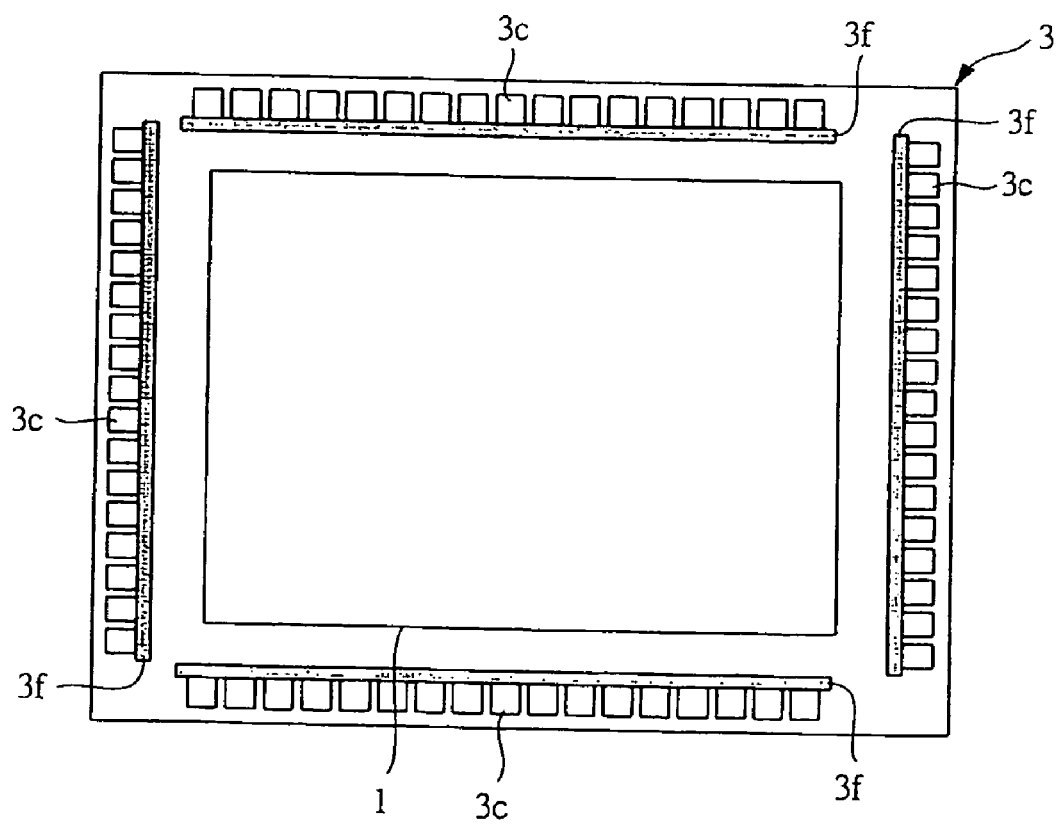
FIG. 12 is a plan view showing an example of the structure of a semiconductor chip mounted by the die bonding method of FIG. 11.

FIG. 1 is a cross sectional view showing an example of the structure of a semiconductor device according to the first embodiment of the present invention, FIG. 2 is a plan view showing an example of the conductor pattern on the main surface of the wiring board incorporated in the semiconductor device of FIG. 1, FIG. 3 is a bottom plan view showing an example of the conductor pattern on the rear surface of the wiring board of FIG. 2, FIG. 4 is an enlarged partial plan view showing an example of the configuration of an area A in FIG. 2, FIG. 5 is an enlarged partial plan view showing a modified example of the configuration of the area A in FIG. 2, FIG. 6 is a plan view showing the insulating film formed on the main surface of the wiring board in a modified example, FIG. 7 is an enlarged partial plan view showing an example of the shape of the conductor pattern of an area B in FIG. 2, FIG. 8 is an enlarged partial plan view showing a modified example of the conductor pattern of the area B in FIG. 2, FIG. 9 is a cross sectional view illustrating an example of the method of applying a die bonding material used in the process of assembling the semiconductor device of FIG. 1, FIG. 10 is a plan view showing the applied die bonding material by means of the method of FIG. 9, FIG. 11 is a cross sectional view showing an example of the method of die bonding in the process of assembling the semiconductor device of FIG. 1, and FIG. 12 is a plan view showing an example of the structure of a semiconductor chip mounted by the die bonding method of FIG. 11.

The semiconductor device in the first embodiment of the present invention is a resin-sealed semiconductor package in which a semiconductor chip 1 is mounted on a wiring board. In the description of the first embodiment, a BGA (Ball Grid Array) 7 shown in FIG. 1 is taken as an example of the semiconductor device.

Firstly, the structure of the BGA 7 will be described. The BGA 7 comprises a package substrate 3, a semiconductor chip 1, a plurality of conductive wires 4, a resin sealing body 6, and a plurality of solder balls 8. The substrate 3 has a main surface 3a and a rear surface 3b. A plurality of bonding electrodes 3c are arranged along the peripheral edges of a chip mounting region at the center of the main surface 3a, and wirings 3d connected to the respective bonding electrodes 3c are formed on the main surface 3a. The package substrate 3 is a wiring board on which the wirings 3d are electrolessly plated. The semiconductor chip 1 is mounted in the chip mounting region on the main surface 3a of the package substrate 3 by way of a die bonding material 2. The plurality of wires 4 connect the pads 1a formed on the main surface 1b of the semiconductor chip 1 and functioning as electrodes and a plurality of corresponding bonding electrodes 3c. The resin sealing body 6 seals the semiconductor chip 1 and the plurality of wires 4 with resin. The plurality of solder balls 8 functioning as external terminals are provided on the rear surface 3b of the package substrate 3. On the main surface 3a of the package substrate 3, the wirings 3d are formed only in an area located at the inner side of the plurality of bonding electrodes 3c. A solder resist film (insulating film) 3e is formed below the semiconductor chip 1. In other words, no solder resist film is formed in the area of the main surface 3a located at the outer side of the plurality of bonding electrodes 3c.

More specifically, the BGA 7 of the first embodiment has a structure in which no solder resist film 3e is formed at the outer side of the plurality of bonding electrodes 3c that are arranged in a peripheral area of the main surface 3a of the package substrate 3. With this arrangement, the area of the package substrate 3 located at the outer side of the bonding electrodes 3c is minimized and thus the BGA 7 can be down sized without changing the size of the chip mounted on the package substrate.

In other words, it is possible to increase the size of the chip to be mounted on a package substrate even in a small semiconductor device.

Since no solder resist film 3e is formed at the outer side of the bonding electrodes 3c, no power supply wirings to be used for plating are arranged either at the outer side of the bonding electrodes 3c. Therefore, the wirings 3d are electrolessly plated on the package substrate 3 of the BGA 7.

With the above described arrangement, it becomes possible to make the package size of the BGA 7 almost equal to the chip size.

Additionally, since the sealing body 6 and the base member 3m of the package substrate 3 directly contact with each other at the outer side of the bonding electrodes 3c, it is possible to improve the adhesion therebetween. Also, it is possible to eliminate the possible routes through which moisture invades and improve the moisture resistance, and hence, the reliability of the product can be enhanced.

Note that it is also permissible that the power supply wirings for plating are formed in advance at the outer side of the bonding electrodes 3c on the package substrate 3 so as to supply the power for the plating to the wirings 3d, and thereafter, the power supply wirings for plating is removed by etching. However, the electroless plating is more preferable from the viewpoint of processing accuracy.

The package substrate 3 is, for example, a glass-fiber reinforced epoxy substrate and a plurality of through holes 3h are formed in the main surface 3a of the substrate as shown in FIG. 2, while a plurality of bump lands 3k connected to the respective through holes 3h are formed on the rear surface 3b as shown in FIG. 3.

Also, the wires 4 are, for example, gold wires.

In the BGA 7 of the first embodiment, the solder resist film 3e, which is an insulating film, is formed at least in the area that corresponds to the position below the chip on the main surface 3a of the package substrate 3. In the case of the BGA 7 of FIG. 1, the solder resist film 3e is arranged so as to cover all the through holes 3h of the main surface 3a including the through holes 3h arranged below the chip.

The shaded areas in FIGS. 2 to 6 and 8 are areas where the solder resist film 3e is formed.

Thus, as shown in FIG. 2, the solder resist film 3e is formed on all the threshold holes 3h in the main surface 3a of the package substrate 3 of the BGA 7 of the first embodiment, and a plurality of dummy patterns 3i, which are dummy conductor portions, are arranged in a matrix form in the chip mounting region at the center of the package substrate 3, and further, the solder resist film 3e is formed to cover and isolate the plurality of dummy patterns 3i.

With this arrangement, the solder resist film 3e is formed below the chip, and therefore, the semiconductor chip 1 and the wirings 3d are insulated from each other. Hence, it is possible to prevent the short-circuit between the semiconductor chip 1 and the wirings 3d.

Additionally, since the solder resist film 3e is formed to cover all the through holes 3h of the main surface 3a, the through holes 3h can be filled with the solder resist film 3e, and hence, it is possible to prevent the air bubbles from being formed in the through holes 3h below the chip.

Consequently, it is possible to prevent the cracks from being formed in the package substrate 3 and the semiconductor chip 1 due to the burst of the air bubbles during the reflow process.

On the other hand, as shown in FIG. 3, a plurality of dummy patterns 3i are arranged in a matrix form at the center of the rear surface 3b so as to correspond to the main surface 3a, and the solder resist film 3e is formed on the entire rear surface 3b except the connecting portions of the bump lands 3k so that the plurality of dummy patterns 3i in the central portion are covered with the solder resist film 3e and insulated.

Thus, a plurality of dummy patterns 3i are formed in the central portion of both the main surface 3a and the rear surface 3b to improve the rigidity of the substrate, and at the same time, conductor patterns including the through holes 3h and the bump lands 3k and the solder resist film 3e are formed on the main surface 3a and the rear surface 3b over the entire areas thereof. Therefore, it is possible to prevent the warping of the package substrate 3.

Additionally, since the plurality of dummy patterns 3i are arranged uniformly in a matrix form in the chip mounting region of the main surface 3a, the flatness of the chip mounting region of the package substrate 3 can be improved. As a result, it is possible to withstand the load when the chip is subjected to pressure during the die bonding process by the plurality of dummy patterns 3i, and thus, the cracks in the chip during the die bonding process can be prevented.

When the solder resist film 3e is formed on the through holes 3h of the package substrate 3, it is preferable to form the solder resist film within the surface areas of the through hole lands 3n as shown in FIG. 4. In addition, when each through hole 3h and the corresponding wiring 3d are formed to have a tapered profile or a tear drop profile as shown in FIG. 5, it is also preferable to form the solder resist film 3e so as to entirely cover the corresponding through hole land 3n with an edge of the solder resist film 3e passing across the tapered area of the conductor pattern.

When the thermal expansion coefficient of the solder resist film 3e is large in comparison to that of the base member 3m of the package substrate 3 and the thermal stress is generated in the BGA 7, the internal stress caused due to the thermal stress is concentrated on the edges of the solder resist film 3e. However, in the case of the arrangements of FIGS. 4 and 5, the solder resist film 3e is not terminated at the position where the width of the wiring 3d becomes smallest. Therefore, the wiring 3d is prevented from being broken due to the difference in the thermal expansion coefficient of the wiring 3d and that of the solder resist film 3e.

Additionally, on the main surface 3a of the package substrate 3 of the BGA 7, projecting wall portions 3f of the solder resist film 3e, which is an insulating film, are formed between the semiconductor chip 1 and the rows of the bonding electrodes 3c as shown in FIGS. 1 and 2.

More specifically, the elongated wall portions 3f formed of the solder resist film 3e and projecting upward are formed between each of the sides of the semiconductor chip 1 and the corresponding row of the bonding electrodes 3c.

Therefore, it is possible to prevent a die bonding material 2 (paste material) from flowing (bleeding) toward the bonding electrodes 3c and spreading over during the die bonding process, and thus, the adhesion and the contamination of the bonding electrodes 3c can be prevented, and further, the defective connections during the bonding process can be prevented. As a result, it becomes possible to stably perform the wire bonding and the pressure bonding, and therefore, both the reliability and the quality of the product can be improved.

Alternatively, it is also possible to form grooves (recesses) 3g of the solder resist film 3e instead of the wall portions 3f as shown in the modified example of FIG. 6.

More specifically, an elongated groove 3g recessed downward is formed in the solder resist film 3e between each of the sides of the semiconductor chip 1 and the corresponding row of the bonding electrodes 3c.

Similar to the case of the walls 3f, the grooves 3g can prevent the die bonding material 2 from flowing toward the bonding electrodes 3c and spreading over during the die bonding process, and thus, the adhesion to and the contamination of the bonding electrodes 3c can be prevented and the defective connections during the bonding process can be prevented. As a result, similar to the case described above, it becomes possible to stably perform the wire bonding and the pressure bonding, and therefore, both the reliability and the quality of the product can be improved.

Also, as shown in FIG. 7, if the length of each of the plurality of bonding electrodes 3c of the package substrate 3 of the BGA 7 of the first embodiment in the first direction 9 extending from the center of the package substrate 3 toward the outside is defined as A and the length of the bonding electrode 3c in the second direction 10 that is perpendicular to the first direction is defined as B, the plan view of the bonding electrode 3c shows the relationship of A☐B.

In other words, the length (A) of the bonding electrode 3c in the first direction 9 which is equal to the direction of the wiring 3d of the bonding electrode 3c and the length (B) of the binding electrode 3c in the second direction 10 which is equal to the direction perpendicular to the first direction 9 show the relationship of A☐B. In short, the length of the bonding electrode 3c in the direction of the row of a plurality of bonding electrodes 3c is larger than the length thereof in the direction perpendicular to the former direction.

Thus, when connecting a pair of wires 4 to each bonding electrode 3c and if the length between the contact points P of the pair of wires 4 in the first direction 9 is defined as Y and the length therebetween in the second direction 10 is defined as X, the pair of wires 4 can be connected so as to satisfy the relationship of X>Y.

With this arrangement, in the case of the double bonding in which a pair of wires 4 are connected to a single bonding electrode 3c, the pair of wires 4 can be arranged with ease in the direction of the row of bonding electrodes on the bonding electrode 3c. Additionally, if the pair of wires 4 are brought onto the bonding electrode 3c with a large angle when they are connected to the bonding electrode 3c, a sufficient space on which the bonding tool slides can be provided, and therefore, it becomes possible to broaden the permissible scope for the wire bonding operation.

As a result, it is possible to appropriately perform the wire bonding and to secure the stability in the wire bonding operation.

Additionally, it is possible to minimize the idle area at the outer side of the bonding electrodes 3c on the package substrate 3, and therefore, the BGA 7 can be downsized.

As shown in FIG. 8 that illustrates a modified example, it is also preferable that the inner part of each bonding electrode 3c in the first direction 9 is extended toward the center of the substrate and a middle part of the bonding electrode 3c is covered with the solder resist film 3e, which is an insulating film. Also in this modified arrangement, a pair of wires 4 can be connected to the bonding electrode 3c in the direction of the row of bonding electrodes.

Next, the die bonding method that can be used in the process of assembling the semiconductor device of the first embodiment will be described.

FIG. 9 is a schematic diagram illustrating a method of applying a die bonding material 2 (paste material). For example, the die bonding material 2 is applied by means of a multipoint nozzle 11. Preferably, the die bonding material 2 is applied along the diagonals of the rectangular chip mounting region as shown in FIG. 10.

As the die bonding material 2 is applied along the diagonals, it is possible to force out air toward the outside from the center of the chip mounting region so as to avoid the formation of voids when the semiconductor chip 1 is pressed by a pyramidal collet 5 or a planar collet.

Furthermore, in the case of the BGA 7 of the first embodiment, since the walls 3f formed of the solder resist film 3e are formed on the inner sides of the rows of bonding electrodes 3c on the package substrate 3, they prevent the die bonding material 2 from flowing out and the adhesion of the die bonding material 2 to the bonding electrodes 3 and the resulting contamination of the bonding electrodes 3c can be prevented.

FIG. 12 is a schematic diagram showing the chip mounting structure when the die bonding process is completed.

Second Embodiment

Figure 13:
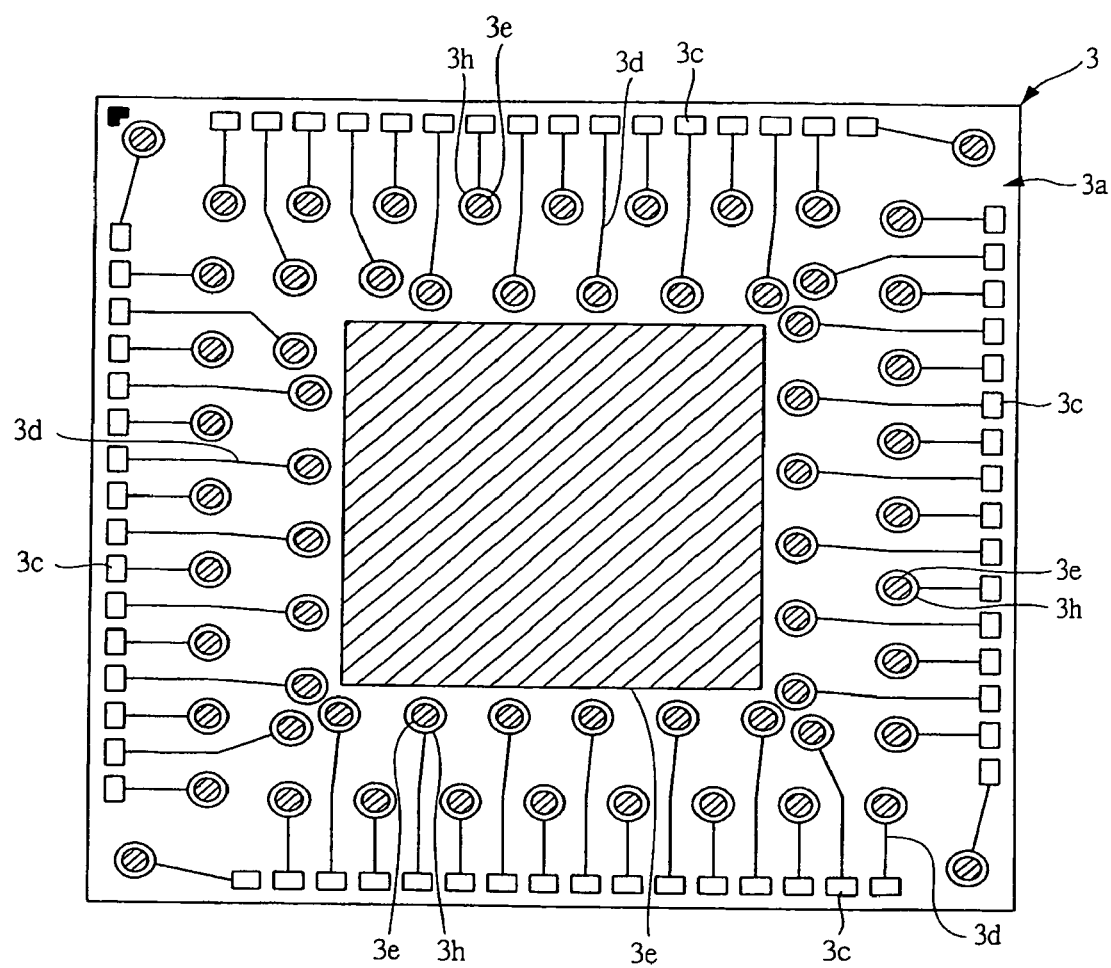
FIG. 13 is a plan view showing an example of the conductor pattern on the main surface of the wiring board according to the second embodiment of the present invention.
Figure 14:
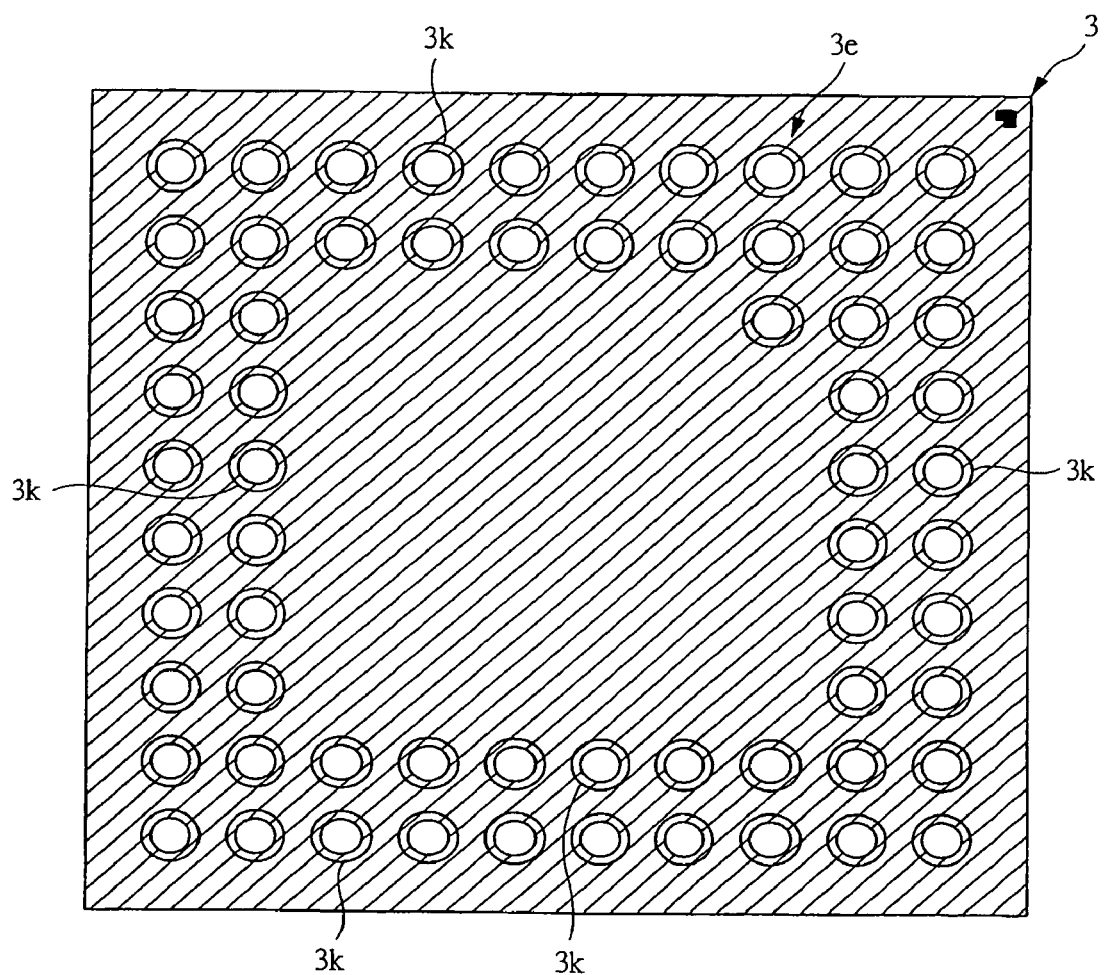
FIG. 14 is a bottom plan view showing an example of the conductor pattern on the rear surface of the wiring board of FIG. 13.
Figure 15:
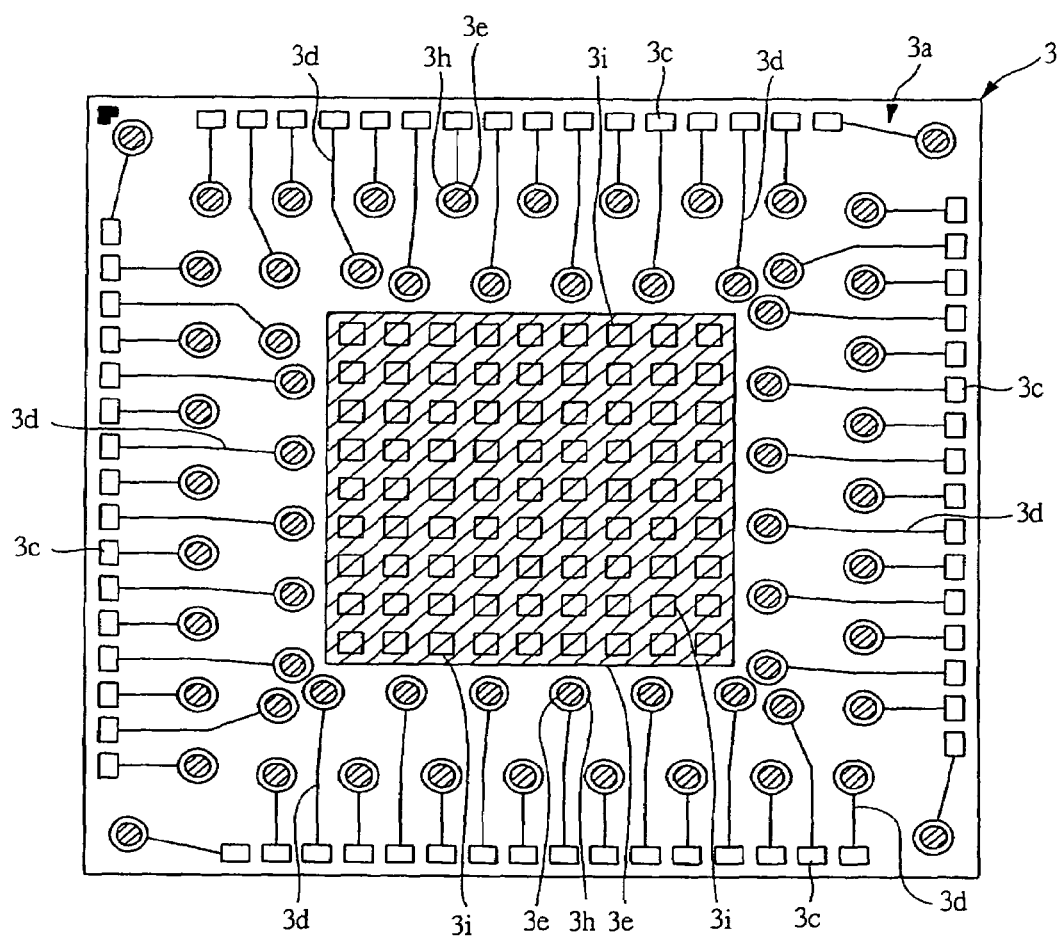
FIG. 15 is a plan view showing the conductor pattern on the main surface of the wiring board in a modified example of the second embodiment of the present invention.
Figure 16:
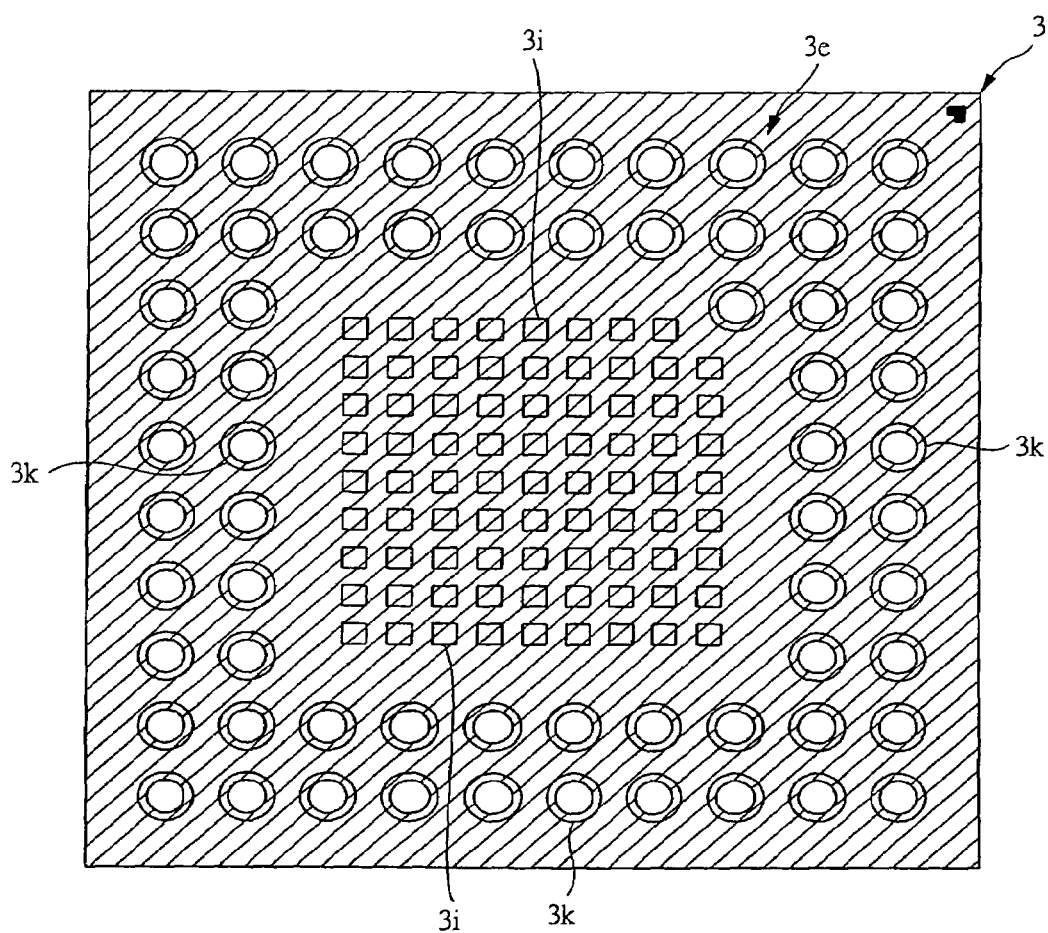
FIG. 16 is a bottom plan view showing an example of the conductor pattern on the rear surface of the wiring board of FIG. 15.
Figure 17:
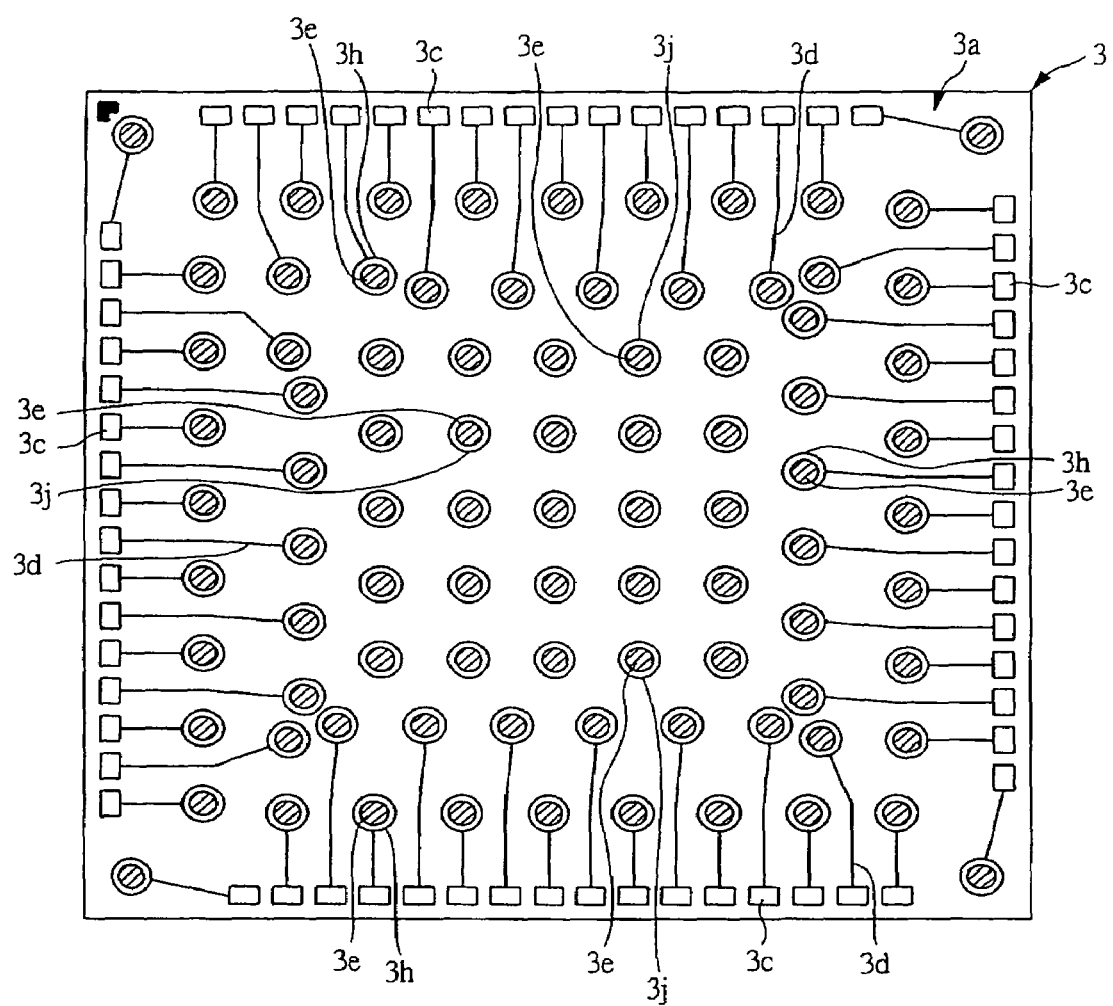
FIG. 17 is a plan view showing the conductor pattern on the main surface of a wiring board in a modified example of the second embodiment of the present invention.
Figure 18:
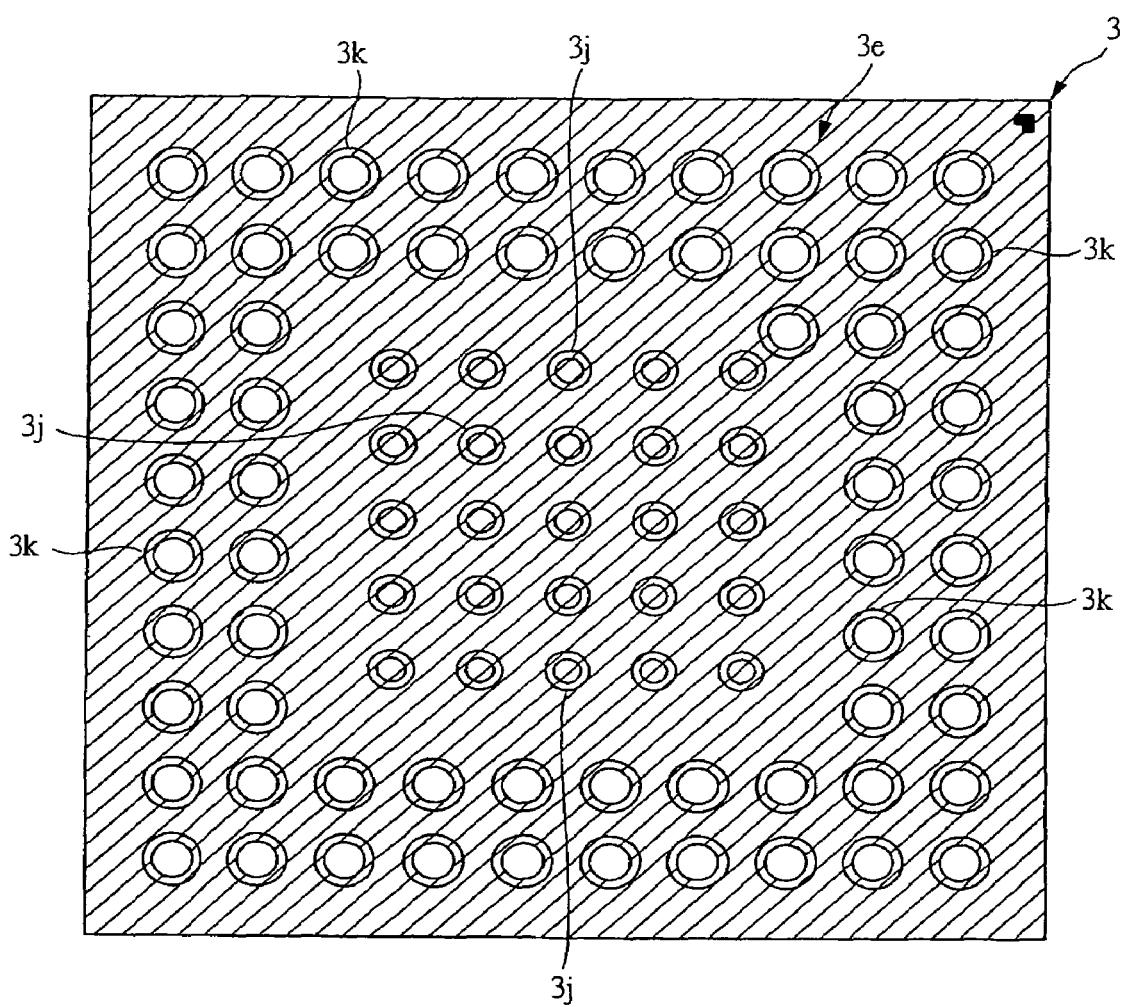
FIG. 18 is a bottom plan view showing an example of the conductor pattern on the rear surface of the wiring board of FIG. 17.
Figure 19:
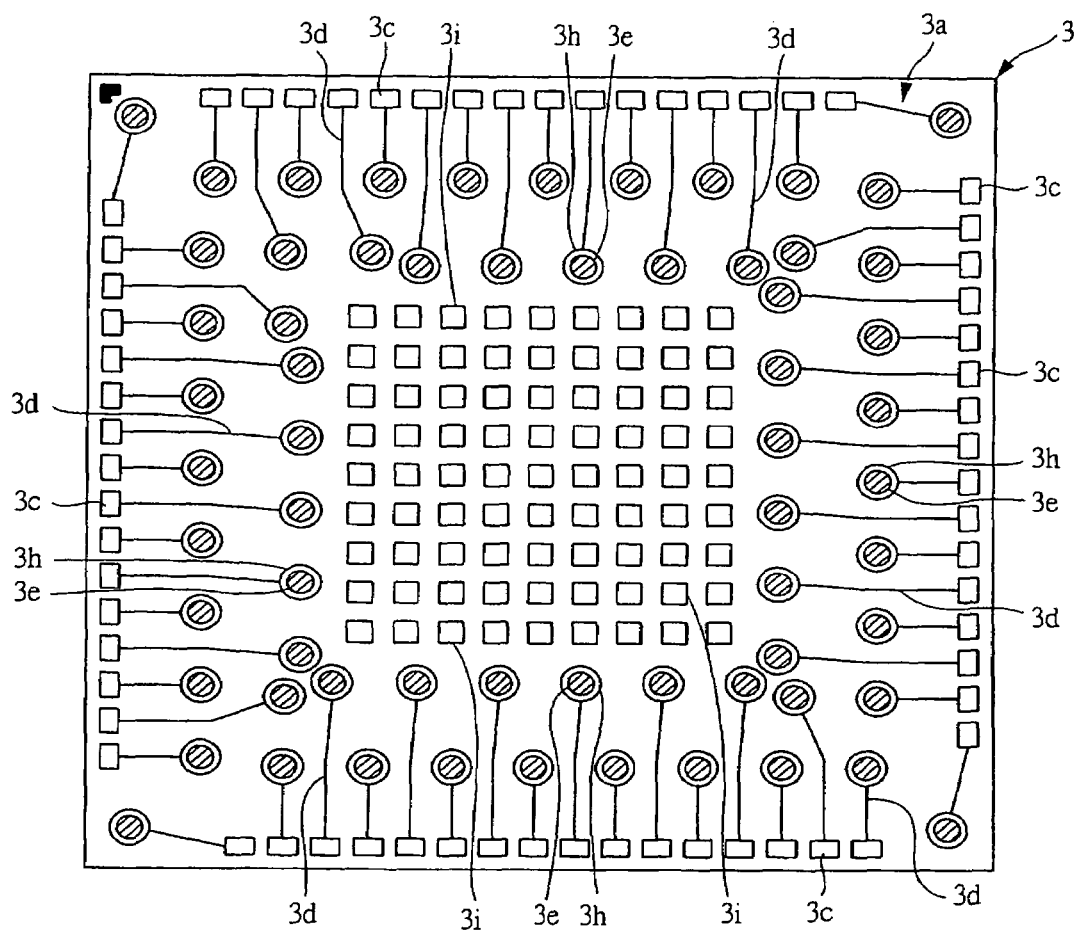
FIG. 19 is a plan view showing the conductor pattern on the main surface of a wiring board in a modified example of the second embodiment of the present invention.
Figure 20:
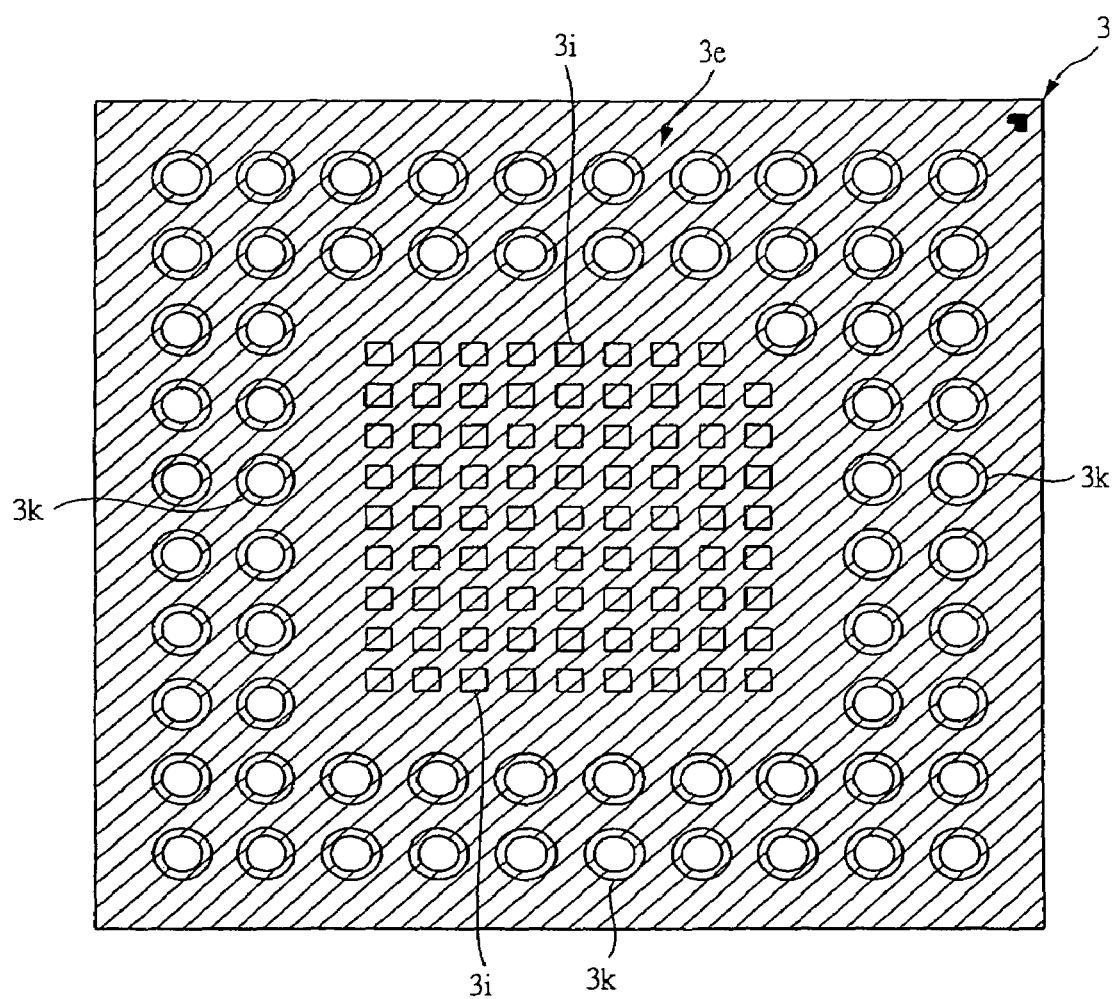
FIG. 20 is a bottom plan view showing an example of the conductor pattern on the rear surface of the wiring board of FIG. 19.
Figure 21:
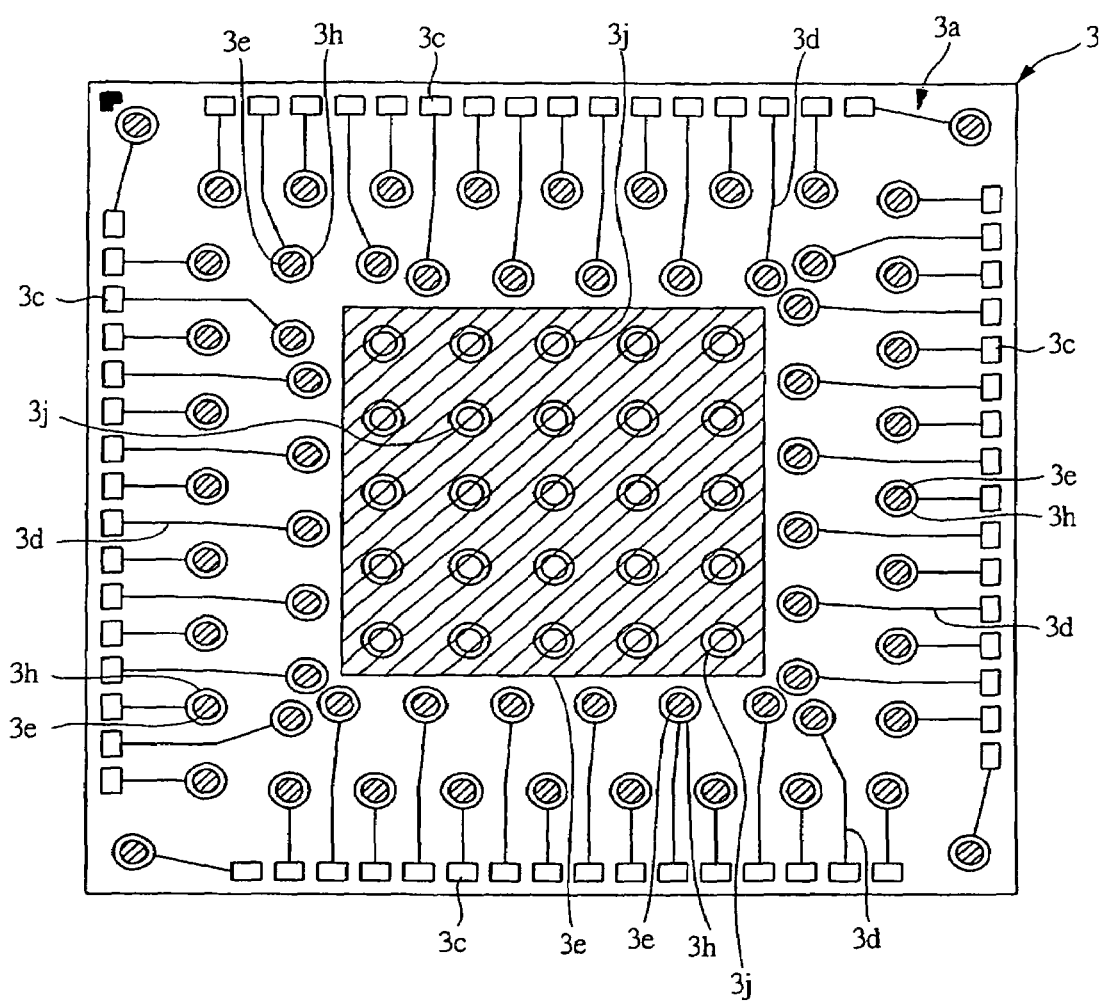
FIG. 21 is a plan view showing the conductor pattern on the main surface of a wiring board in a modified example of the second embodiment of the present invention.
Figure 22:
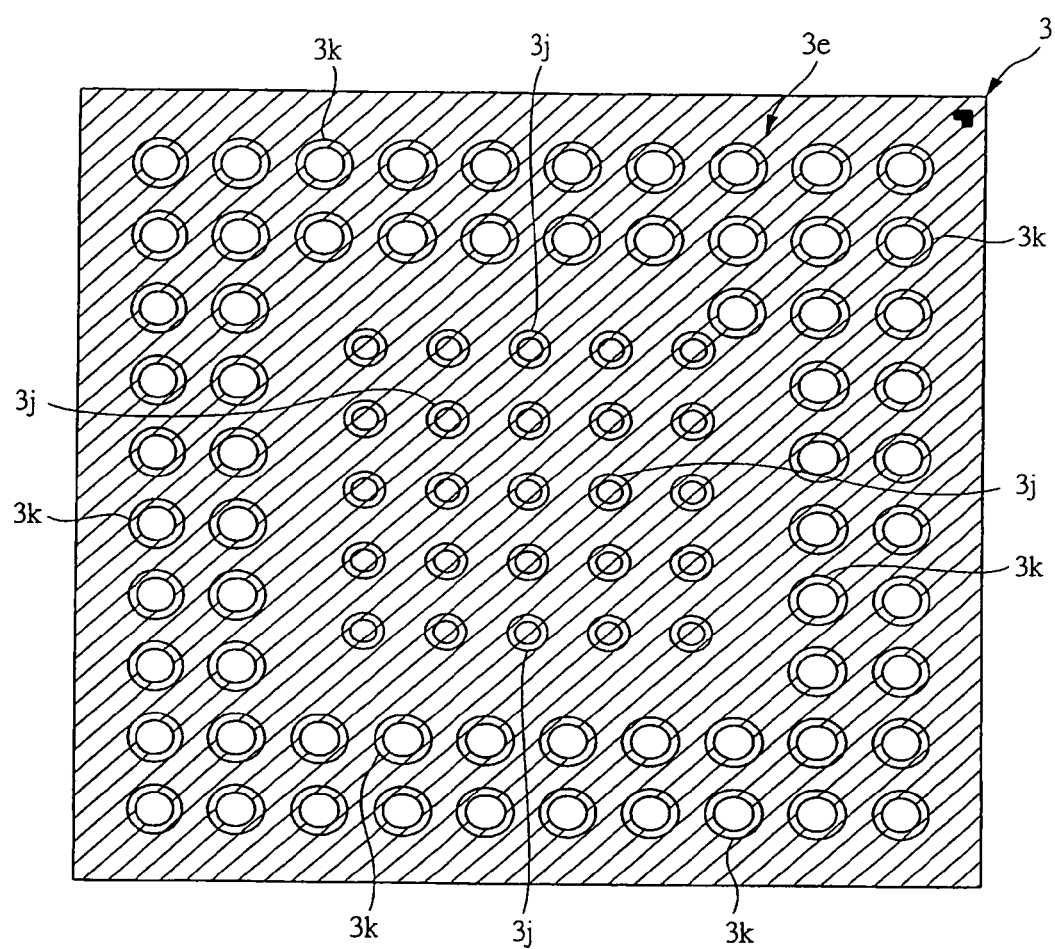
FIG. 22 is a bottom plan view showing an example of the conductor pattern on the rear surface of the wiring board of FIG. 21.

FIG. 13 is a plan view showing an example of the conductor pattern on the main surface of the wiring board according to the second embodiment of the present invention, FIG. 14 is a bottom plan view showing the conductor pattern on the rear surface of the wiring board of FIG. 13, FIG. 15 is a plan view showing the conductor pattern on the main surface of the wiring board in a modified example of the second embodiment of the present invention, FIG. 16 is a bottom plan view showing the conductor pattern on the rear surface of the wiring board of FIG. 15, FIG. 17 is a plan view showing the conductor pattern on the main surface of the wiring board in a modified example of the second embodiment of the present invention, FIG. 18 is a bottom plan view showing the conductor pattern on the rear surface of the wiring board of FIG. 17, FIG. 19 is a plan view showing the conductor pattern on the main surface of the wiring board in a modified example of the second embodiment of the present invention, FIG. 20 is a bottom plan view showing the conductor pattern on the rear surface of the wiring board of FIG. 19, FIG. 21 is a plan view showing the conductor pattern on the main surface of the wiring board in a modified example of the second embodiment of the present invention, and FIG. 22 is a bottom plan view showing the conductor pattern on the rear surface of the wiring board of FIG. 21.

Similar to the BGA 7 in the first embodiment, the semiconductor device in the second embodiment is a resin-sealed BGA in which a semiconductor chip 1 is mounted on a wiring board. The BGA of this embodiment differs from the BGA 7 of the first embodiment in that the solder resist film 3e, which is an insulating film, is not arranged on the wirings 3d formed on the main surface 3a of the package substrate 3.

The shaded areas in FIGS. 13 to 22 are areas where the solder resist film 3e is formed.

As shown in FIG. 13, the solder resist film 3e is not formed on the wirings 3d at all on the main surface 3a of the package substrate 3, which is a wiring board to be incorporated into the semiconductor device of the second embodiment.

Since the solder resist film 3e is not formed on the wirings 3d as described above, it is possible to prevent the wirings 3d from being broken.

More specifically, if the solder resist film 3e is applied on the wirings 3d, the wirings 3d arranged under the solder resist film 3e is directly subjected to the thermal stress of the solder resist film 3e and the wirings 3d are broken. The influence of the stress is particularly remarkable and the wirings 3d are frequently broken when the wirings 3d have a small width and do not have a sufficient level of strength.

For its prevention, in the package substrate 3 of the second embodiment shown in FIG. 13, the solder resist film 3e is not arranged on the wirings 3d. By doing so, the wirings 3d are not subjected to the thermal stress of the solder resist film 3e. This is because the wirings 3d are plated with Au and hence the sealing resin does not adhere to the wirings 3d. More specifically, the sealing resin can slide on the wirings 3d and hence the stress is not concentrated on a particular part of the wirings 3d. As a result, it is possible to prevent the wirings from being broken.

Additionally, since the solder resist film 3e is not arranged on the wirings 3d, the wirings 3d can be plated with ease. For example, it is preferable that the copper wirings are plated with Ni—Au. By doing so, the rigidity of the wirings 3d can be improved and the breakage of the wirings can be prevented.

Since the wirings 3d are not subjected to the thermal stress from the solder resist film 3e that has a large thermal expansion coefficient, the package substrate 3 of this embodiment is particularly effective when used as the substrate on which the wirings with a small width are arranged at fine pitch.

Therefore, it is possible to improve the reliability to thermal stress such as the temperature cycle even when wirings are arranged at fine pitch. Also, even when the wirings on the substrate are required to have a very small width, the rigidly of the wirings 3d can be improved by the with Ni—Au plating.

Furthermore, it is possible to set the width of the wirings to the minimum value that the manufacturer can provide.

Similar to the case of the package substrate 3 of the first embodiment, the solder resist film 3e is not formed at the outer sides of the plurality of bonding electrodes 3c on the package substrate 3 of the second embodiment illustrated in FIG. 13, and the wirings 3d are formed only in a region located at the inner side of the plurality of bonding electrodes 3c.

With this arrangement, it is possible to minimize the area at the outer side of the bonding electrodes 3c on the package substrate 3, and therefore, the semiconductor device can be downsized.

Also, in the case of the package substrate 3 of FIG. 13, the solder resist film 3e is formed in the idle region located in a central region of the main surface 3a of the substrate 3. On the other hand, the solder resist film 3e is formed on the entire rear surface 3b of the package substrate 3 except the connecting portions of the bump lands 3k as shown in FIG. 14.

Thus, since the solder resist film 3e is formed in a central region of the main surface 3a and also in a central region of the rear surface 3b, it is possible to prevent the warping of the package substrate 3.

Next, the package substrate 3 in FIG. 15 shows a modified example which has almost the same structure as that of the package substrate 3 in the first embodiment in FIG. 2. The package substrate 3 in this modified example is different from the package substrate 3 in FIG. 2 in that the solder resist film 3e is not formed on the wirings 3d and hence no wall portion 3f of the solder resist film 3e is formed on the package substrate 3.

Because the solder resist film 3e is not formed on the wirings 3d of the package substrate 3, it is possible to prevent the breakage of the wiring.

Note that the other structure of the package substrate 3 of the second embodiment shown in FIGS. 15 and 16 is identical to that of the package substrate 3 of the first embodiment shown in FIGS. 2 and 3.

Next, the package substrates 3 of other modified examples shown in FIGS. 17, 19 and 21 will be described.

Since the package substrates 3 illustrated in FIGS. 17, 19 and 21 have the same structure as that of the package substrate 3 of FIG. 13 except the respective central regions, only the central regions of the package substrates 3 of the modified examples will be described below.

Firstly, the package substrate 3 of FIG. 17 has a plurality of dummy through holes 3j arranged in a matrix form in a central region of the main surface 3a and also in a central region of the rear surface 3b. More specifically, a plurality of through holes 3h and a plurality of dummy through holes 3j are arranged on the main surface 3a, while a plurality of bump lands 3k and a plurality of dummy through holes 3j are arranged on the rear surface 3b as shown in FIG. 18.

In this structure, the solder resist film 3e is formed only on all of the through holes 3h including the dummy through holes 3j on the main surface 3a, while the solder resist film 3e is formed on the entire rear surface 3b including the plurality of dummy through holes 3j except the connecting portions of the bump lands 3k.

With this arrangement, the rigidity of the substrate is improved by the plurality of dummy through holes 3j in the central region on the main surface 3a and those in the central region on the rear surface 3b. Additionally, since the solder resist film 3e is formed almost all over the package substrate 3, it is possible to prevent the warping of the package substrate 3.

Additionally, since a plurality of dummy through holes 3j are arranged in a matrix form at regular intervals in the chip mounting region of the main surface 3a, the flatness of the chip mounting region of the package substrate 3 can be improved.

Next, the package substrate 3 of FIG. 19 has a plurality of dummy patterns 3i arranged in a matrix form in a central region of the main surface 3a and also in a central region of the rear surface 3b. More specifically, a plurality of through holes 3h and a plurality of dummy patterns 3i are arranged on the main surface 3a, while a plurality of bump lands 3k and a plurality of dummy patterns 3i are arranged on the rear surface 3b as shown in FIG. 20.

In this structure, the solder resist film 3e is formed only on the through holes 3h of the main surface 3a, while the solder resist film 3e is formed on the entire rear surface 3b except the connecting portions of the bump lands 3k.

With this arrangement, the rigidity of the substrate is improved by the plurality of dummy patterns 3i in the central region on the main surface 3a and those in the central region on the rear surface 3b. Additionally, it is possible to prevent the warping of the package substrate 3.

Additionally, since a plurality of dummy patterns 3i are arranged in a matrix form at regular intervals in the chip mounting region of the main surface 3a, the flatness of the chip mounting region of the package substrate 3 can be improved.

Next, the package substrate 3 of FIG. 21 has a plurality of dummy through holes 3j arranged in a matrix form in a central region of the main surface 3a and also in a central region of the rear surface 3b. More specifically, a plurality of through holes 3h and a plurality of dummy through holes 3j are arranged on the main surface 3a, while a plurality of bump lands 3k and a plurality of dummy through holes 3j are arranged on the rear surface 3b as shown in FIG. 22.

In this structure, the solder resist film 3e is formed on the central region of the main surface 3a so as to cover the plurality of dummy through holes 3j and only on the through holes 3h around the central region, while the solder resist film 3e is formed on the entire rear surface 3b including the plurality of dummy through holes 3j except the connecting portions of the bump lands 3k.

With this arrangement, the rigidity of the substrate is improved by the plurality of dummy through holes 3j in the central region on the main surface 3a and those in the central region on the rear surface 3b. Additionally, since the solder resist film 3e is formed almost all over the package substrate 3, it is possible to prevent the warping of the package substrate 3.

Additionally, since a plurality of dummy through holes 3j are arranged in a matrix form at regular intervals in the chip mounting region of the main surface 3a, the flatness of the chip mounting region of the package substrate 3 can be improved.

Note that the advantages obtained by the other structures of the package substrates 3 of the modified examples of FIGS. 17, 19 and 21 are identical to those of the package substrate 3 of FIG. 13.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although the first and second embodiments of the present invention are described with using the BGA 7 as an example of a semiconductor device, the present invention is not limited to the BGA 7 but equally applicable to other semiconductor devices such as LGA (Land Grid Array) so long as the semiconductor device is assembled by using a wiring board.

The present invention can be suitably applied to electronic devices and semiconductor devices that comprise a wiring board.

What is claimed is:

1. A semiconductor device comprising:
    a base material including a main surface and a rear surface opposing to the main surface;
    a plurality of bonding electrodes formed along a peripheral portion of the main surface of the base material;
    a plurality of wirings respectively connected with each of the plurality of bonding electrodes and formed only inside each of the plurality of bonding electrodes such that the bonding electrodes are located between the plurality of wirings and the peripheral portion of the main surface of the base material;
    a first dummy pattern formed at a central portion of the main surface of the base material;
    a first insulating film formed over the main surface of the base material such that both the plurality of wirings and the first dummy pattern are substantially covered with the first insulating film;
    a plurality of bump lands formed on the rear surface of the base material;
    a second dummy pattern formed at a central portion of the rear surface of the base material;
    a second insulating film formed on the rear surface of the base material such that each of the plurality of bump lands is exposed from the second insulating film and the second dummy pattern is covered with the second insulating film;
    a semiconductor chip mounted over the first insulating film by way of a paste material, the semiconductor chip including a main surface and a plurality of pads formed on the main surface, wherein the first insulating film separates the semiconductor chip from the plurality of wirings;
    a plurality of wires electrically connecting the plurality of pads of the semiconductor chip with the plurality of bonding electrodes of the base material, respectively;
    a sealing body sealing the semiconductor chip, the plurality of wires and the main surface of the base material; and
    a plurality of external terminals formed on the plurality of bump lands, respectively;
    wherein the first insulating film is not formed between each of the plurality of bonding electrodes and the closest peripheral edges of the peripheral portion of the base material;
    wherein a concaved portion is formed at the first insulating film located between each of the plurality of bonding electrodes and the semiconductor chip;
    wherein the peripheral portion of the main surface of the base material, which is not covered with the first insulating film, is contacted with the sealing body; and
    wherein, for each of the bonding electrodes, a distance between the bonding electrode and the closest peripheral edge of the peripheral portion of the base material is shorter than a distance between the bonding electrode and the semiconductor chip.

2. A semiconductor device according to claim 1, wherein a plurality of through holes are formed in the base material, and
    wherein the plurality of bump lands are connected with the plurality of through holes, respectively.

3. A semiconductor device according to claim 2, wherein at least one of the first insulating film or the second insulating film are injected inside of opening portions of each of the plurality of through holes.

4. A semiconductor device according to claim 3, wherein a plurality of first dummy patterns are formed on the main surface of the base material as a grid-like pattern, and
    wherein a plurality of second dummy patterns are formed on the rear surface of the base material as a grid-like pattern.

5. A semiconductor device according to claim 1, wherein the peripheral portion of the main surface of the base material is covered with the sealing body.

6. A semiconductor device according to claim 1, wherein the concaved portion is formed as an elongated region extending substantially parallel to a peripheral edge of the main surface of the base material at the peripheral portion thereof, and located between the plurality of bonding electrodes and an outer edge of the paste material mounting the semiconductor chip to protect the bonding electrodes from coming into contact with the past material by providing a concaved portion for the paste material to flow into.

7. A semiconductor device according to claim 2, wherein the plurality of wirings are connected with the plurality of through holes, respectively.

* * * * *